United States Patent [19]

Kawamura et al.

[11] Patent Number: 5,579,199

[45] Date of Patent: Nov. 26, 1996

[54] NON-VOLATILE MEMORY DEVICE AND A METHOD FOR PRODUCING THE SAME

[75] Inventors: Tadashi Kawamura, Tenri; Naofumi Kimura, Nara; Yoshitaka Yamamoto, Yamatokoriyama; Yutaka Ishii, Nara, all of Japan

[73] Assignee: Sharp Kabushiki Kaisha, Osaka, Japan

[21] Appl. No.: 158,258

[22] Filed: Nov. 24, 1993

[30] Foreign Application Priority Data

Nov. 26, 1992 [JP] Japan .................................. 4-317415
Mar. 23, 1993 [JP] Japan .................................. 5-064393

[51] Int. Cl.⁶ .................................................. G11C 13/04
[52] U.S. Cl. ................................................ 365/108; 365/149
[58] Field of Search ................................ 365/102, 149, 365/150

[56] References Cited

U.S. PATENT DOCUMENTS

| | | | |
|---|---|---|---|
| 3,350,691 | 10/1967 | Faulis et al. | 365/102 |
| 3,836,243 | 9/1974 | Melchoir | 353/122 |
| 4,596,445 | 6/1986 | Fergason | 350/339 F |
| 4,662,720 | 5/1987 | Fergason | 350/339 F |
| 4,733,370 | 3/1988 | Kitajima | 365/149 |
| 4,775,226 | 10/1988 | Montgomery, Jr. et al. | 350/350 S |
| 5,031,144 | 7/1991 | Persky | 365/145 |

FOREIGN PATENT DOCUMENTS

| | | |
|---|---|---|
| 0540153A2 | 5/1993 | European Pat. Off. . |
| 58-501631 | 9/1983 | Japan . |
| 59-155880 | 9/1984 | Japan . |
| 59-226322 | 12/1984 | Japan . |
| 61-502128 | 9/1986 | Japan . |
| WO83/01016 | 3/1983 | WIPO . |
| WO85/04262 | 9/1985 | WIPO . |

OTHER PUBLICATIONS

Patent Abstracts of Japan, vol. 15, No. 196, (1991) and JP–A–03 046621.
Patent Abstracts of Japan, vol. 12, No. 74 (1988) and JP–A–62 212620.
T. Kakinuma et al., *Japan Display '92*, pp. 851–854 (1992).
P. S. Drzaic, *Journal of Applied Physics*, 60(6):2142–2148 (1986).
C. Bowry et al., *Eurodisplay '90*, pp. 158–161 (1990).

*Primary Examiner*—Terrell W. Fears
*Attorney, Agent, or Firm*—David G. Conlin; Peter F. Corless; Brian L. Michaelis

[57] ABSTRACT

A non-volatile memory device according to the present invention includes: a substrate; a storage medium provided above the substrate; a writing unit having a heating unit provided above the substrate, for heating the storage medium by the heating unit to write data in the storage medium with a thermal change of a physical value of the storage medium; and a reading unit having an electrical reading unit provided above the substrate, for reading the change of the physical value of the storage medium as data written in the storage medium by the electrical reading unit.

24 Claims, 7 Drawing Sheets

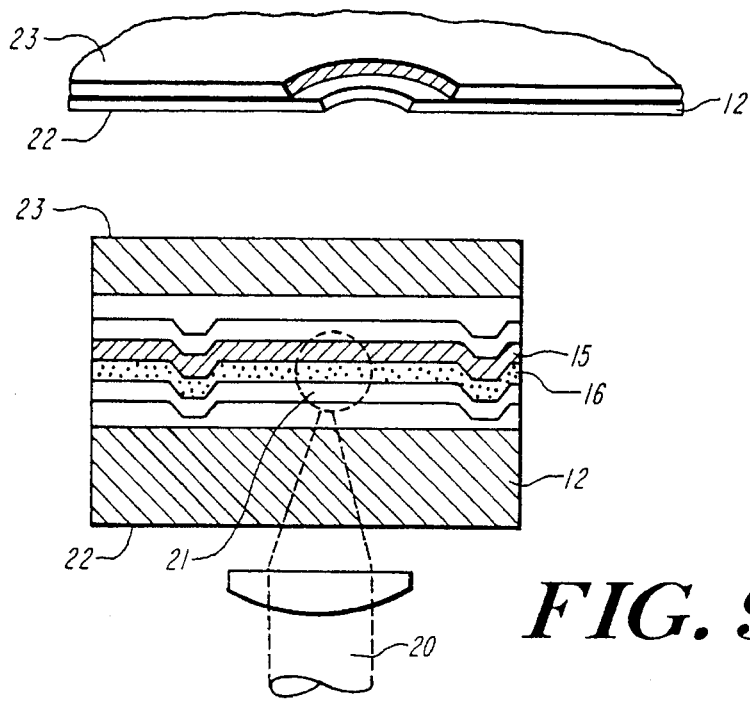
FIG. 9A
FIG. 9B
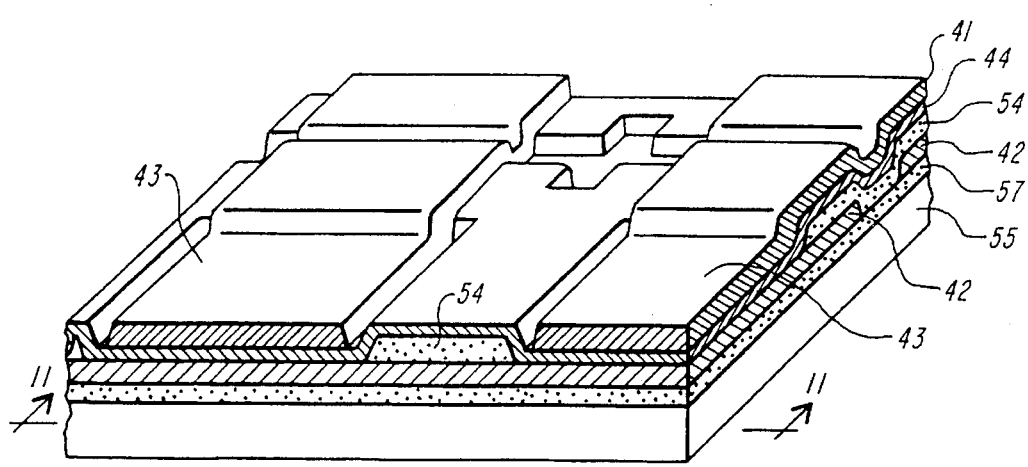
FIG. 10

NON-VOLATILE MEMORY DEVICE AND A METHOD FOR PRODUCING THE SAME

BACKGROUND OF THE INVENTION

1. Field of the Invention

The present invention relates to a non-volatile memory device widely used for equipment such as a computer, a memory card, and a word processor, and a method for producing the same. In particular, the present invention relates to a non-volatile memory device having a high density and a large storage capacity and being capable of electrically writing and reading data and a method for producing the same.

2. Description of the Related Art

There is an example of the above-mentioned non-volatile memory device in which recorded data can be rewritten. The following four kinds are representative of such a device.
(1) A magnetic tape
(2) A magnetic disk
(3) IC non-volatile memories such as an erasable and programmable read only memory (EPROM), an electrically erasable and programmable read only memory (EEPROM), etc.
(4) A magneto-optical disk Hereinafter, the features of each device will be described.

Magnetic tape

A magnetic tape is the most typical rewritable non-volatile memory device. The magnetic tape has been used as an audio tape, a video tape, etc., because of its low cost. In addition, the magnetic tape has a large storage capacity, so that it can be used as a backup memory for a computer.

However, the magnetic tape has the disadvantage of a long access time required for writing and reading data, since data is written and read in a sequential manner, making it impossible to perform a random access.

Magnetic disk

A magnetic disk is used as an external memory device for a computer, a word processor, etc. In general, the magnetic disk is classified into a floppy disk and a hard disk. The floppy disk is easy to handle and costs low, while the hard disk is difficult to handle and costs high. These magnetic disks have the advantages in that a high-speed random access can be performed and data is relatively easily written and read.

The storage capacity of one 3.5-inch floppy disk is about 1 megabyte, and that of one 3.5-inch hard disk is about 40 megabytes. Thus, there is a limit to the storage capacity and density of the magnetic disk.

IC non-volatile memorex

An IC non-volatile memory is capable of recording data with a high density. Examples of the IC non-volatile memory include an EPROM and an EEPROM. In the EPROM, data is electrically written end erased by using UV-rays, while in the EEPROM, data is electrically written and erased. These non-volatile memories have the advantages of a small and light-weight configuration, a short access time, small consumption of electric power, etc.

Hereinafter, the EEPROM will be described in detail.

FIG. 8 is a cross-sectional view showing an example of the EEPROM. In this EEPROM, a source region 8 and a drain region 6 are formed in an upper portion of a silicon substrate 7. Between the source region 8 and the drain region 6, a channel region 9 is formed. A gate oxide film 5 is formed on the silicon substrate 7 provided with the drain region 6 and the source region 8. On the gate oxide film 5, a floating gate 4 and a control gate 2 are formed in this order. Carriers are stored in the floating gate 4. The control gate 2 controls the injection of the carriers into the floating gate 4. The control gate 2 and the floating gate 4 are insulated from each other by an insulating film 3 such as a silicon oxide film. Furthermore, a surface protection film 1 made of a silicon oxide film, a silicon nitride film, etc., is formed over an entire surface the layered structure.

In the case where data is recorded (i.e., written) in the EEPROM with the above-mentioned structure, a voltage is applied across the drain region 6 and the control gate 2 to allow hot electrons as carriers to be injected into the floating gate 4 through the gate oxide film 5. In the case where the recorded data is erased, a voltage is applied across the source region 8 and the control gate 2 to remove the carriers stored in the floating gate 4, utilizing a Fowlef-Nordheim (N-F) Tunneling phenomenon. The reproduction (i.e., read) of the recorded data is performed by judging between ON and OFF based on a threshold voltage of an inversion voltage in the channel region 9 formed between the source region 8 and the drain region 6.

In the EEPROM, the carriers are injected and removed through the gate oxide film 5, so that the quality and thickness of the gate oxide film 5 are very important factors. For example, in the EEPROM having a storage capacity of 1M bits, the gate oxide film 5 generally has a thickness of about 200 Å. Therefore, the regulation of the quality and thickness thereof are difficult. This causes problems of a high cost due to the decrease in yield. Furthermore., the size of a chip is generally about 7 to 10 mm in both short and long sides. If the chip is provided with a large area in order to increase the storage capacity, the yield is decreased, causing a high cost.

For the reasons described above, in recent years, the storage capacity of the EEPROM is about 1 to 4M bits. Thus, the EEPROM has a smaller storage capacity, compared with magneto-optical disks, magnetic disks, etc., which are other kinds of non-volatile memory devices.

Magneto-optical disk

A magneto-optical disk is one of optical disks, which is a typical non-volatile memory device with a large capacity.

FIG. 9 shows an example of the magneto-optical disk. This magneto-optical disk uses, as a record medium, magnetic thin films 15 and 16 having a vertical magnetization characteristic. For recording data, in a weak magnetic field in the opposite direction to the magnetizing direction of the magnetic thin films 15 and 16, a laser beam 20 is condensed at a condensing region 21 in the disk so as to heat this region. In this way, the data is recorded in the magnetic thin films 15 and 16. On the other hand, for reproducing the recorded data, the Kerr effect or Faraday effect are used. That is, when the laser beam 20 which is linearly polarized is irradiated onto the disk, a transmitted light or a reflected light has its polarization plane rotated in accordance with the magnetizing state of the magnetic thin films 15 and 16. The rotation of the polarization plane is converted into a power light signal by an analyzer and the light signal is detected as an electric signal by an photodetector, whereby the data is reproduced The above-mentioned magneto-optical disk has been put to practical use as a memory device with a large storage capacity for filing documents, filing images, etc.

Such a magneto-optical disk uses the laser beam 20, so that data is recorded or reproduced in the storage medium through a transparent glass substrate 12 without a member for emitting the laser beam 20 touching the storage medium. Thus, the dirt on a recording side 23 is negligible. In addition, the beam diameter of the laser beam 20 on a substrate side 22 is about hundreds of μm due to the out-of-focus thereon, so that some dirts on the substrate side 22 are not likely to have adverse effects on the recording of data.

Moreover, since the magneto-optical disk records and reproduces data by using the condensed laser beam 20, mass storage recording with a high density is made possible. For example, about 120 megabytes of data can be stored in one 3.5-inch disk.

However, the magneto-optical disk has the disadvantages of large peripheral equipment and a high cost, since a laser, a magnet, a rotary mechanism, etc. are required for writing and reading data.

The problems of the non-volatile memory devices having the above-mentioned features are summarized as follows:

(1) Difficulty in mass storage recording with a high density

The storage capacity of a 3.5-inch floppy disk is about 1 megabyte. Therefore, mass storage recording with a high density is difficult to perform in the floppy disk.

As for IC non-volatile memories such as an EPROM, an EEPROM, etc., high density can be achieved, but a chip area cannot be increased in view of the yield. Thus, mass storage recording is difficult to perform in the IC non-volatile memories.

(2) Weakness for impact and vibration

In a hard disk, a plurality of disks are integrated in order to achieve mass storage recording, and the distance between a magnetic head and a disk corresponding to the magnetic head is set at 1 μm or less for the purpose of achieving a high density. Because of this structure, the hard disk is likely to break down due to impact and vibration. In addition, the hard disk is likely to break down even due to minute dirts adhering to the magnetic head or any of the integrated disks.

(3) Large-sized, complicated, and cost-consuming peripheral equipment for writing and reading data In either case of a floppy disk, a hard disk, or a magneto-optical disk, data is written and read while a disk is rotated. This makes it necessary to provide a rotary mechanism such as a motor. For this reason, the peripheral equipment is large and complicated.

Particularly in the hard disk, the distance between the magnetic head and the corresponding disk needs to be regulated with good precision and a buffer member is provided for keeping impact-resistance. Therefore, there is a problem that the hard disk tends to be large as a whole and heavy.

As for the magneto-optical disk, a laser and a magnet are used for writing and reading data. This causes the magneto-optical disk to be large, heavy, and cost-consuming.

(4) Long access time for writing and reading data

In either case of a floppy disk, a hard disk, and a magneto-optical disk, there is a limit to the increase in a read speed, since data to be accessed is searched for while a disk is rotated. As for a magnetic tape, a write speed and a read speed are both low.

In order to overcome the problems (1) to (4), the applicant of the present invention has proposed a non-volatile memory using polymer liquid crystal in Japanese Patent Application Nos. 3-138027 and 3-285136. Hereinafter, the outline and problems thereof will be described.

FIGS. 10 and 11 respectively show the structure of the above-mentioned non-volatile memory. The non-volatile memory shown in these figures include two substrates 52 and 55 with a liquid crystal layer 53 sandwiched therebetween. The substrates 52 and 55 are provided with electrodes in a matrix, by which data is written and read.

The substrate 55 is made of silicon. Over the entire surface of the substrate 55, a field insulating film 57 is formed. A plurality of lower electrodes 42 are arranged in a B—B direction (i.e., row direction) on the substrate 55 provided with the field insulating film 57. A plurality of upper electrodes 41 are arranged in an orthogonal direction to the B—B direction (i.e., column direction) above the lower electrodes 42. Between the respective adjacent lower electrodes 42, and between the respective adjacent upper electrodes 41, an inter-electrode insulating film 54 is formed. An heat generating layer 44 is provided between the upper electrodes 41 and the lower electrodes 42. Each intersection of the respective upper electrodes 41 and lower electrodes 42 corresponds to a memory cell 43. The liquid crystal layer 53 is provided with an orientation film 56 on the side of the substrate 55, as shown in FIG. 11. The other substrate 52 is made of glass, The substrate 52 is provided with a counter electrode 51. On the counter electrode 51, an orientation film 58 is formed.

The substrates 52 and 55 are attached to each other and the liquid crystal layer 53 made of polymer nematic liquid crystal is sealed therebetween, thereby obtaining the memory cells 43 as shown in FIG. 11.

In the non-volatile memory thus obtained, data is written by applying an AC voltage to the heat generating layer 44 to heat the liquid crystal layer 53. When the supply of the AC voltage is stopped after heating, the liquid crystal layer 53 is rapidly cooled to form a poly-domain structure. When the supply of the AC voltage is gradually decreased, the liquid crystal layer 53 is gradually cooled to form a mono-domain structure. In order to form the mono-domain structure in the liquid crystal layer 53, the liquid crystal layer 53 may be cooled while being applied with a voltage.

In the non-volatile memory, data is read by applying an AC voltage across the upper electrode 41 and the counter electrode 51 and then measuring the electric capacitance of the liquid crystal layer 53. More specifically, the liquid crystal layer 53 having a poly-domain structure is different from that having a mono-domain structure in dielectric constant. Thus, the difference of electric capacitance caused due to this difference in dielectric constant is measured to read data.

The above-mentioned non-volatile memory has the following problems because of the use of polymer liquid crystal.

First, since two substrates are used in the non-volatile memory using polymer liquid crystal, it is difficult that a driving circuit for driving the memory is integrally formed in the memory. That is, it is difficult to connect a driving circuit provided on the substrate 52 to a plurality of electrodes for reading and writing data provided in a matrix on the other substrate 55, since those electrodes are large in number and provided at a small distance from each other. In addition, small connecting points cause the connection resistance to increase. Because of this, the driving circuit for compensating the influence of the increased connection resistance becomes complicated. These technical difficulties result in low productivity and high cost.

Second, the liquid crystal layer 53 as a record medium has relatively small thermal conductivity. Therefore, it is difficult to uniformly heat the liquid crystal layer 53 so that all of the desired regions of the liquid crystal layer 53 are thermally changed in phase. This is apparent from the results of a computer simulation showing the analysis of heat diffusion in the memory (see FIG. 12).

As shown in FIG. 12, the temperature of a portion of the liquid crystal layer 53 contacting the surface of the heat generating layer 44 to which a voltage is applied is increased to be 58° C., which is enough for the phase transition of the liquid crystal layer 53. The temperature of a portion of the liquid crystal layer 53 in the vicinity of the substrate 52 is 46° C., which is not enough therefor. If a voltage is applied to the liquid crystal layer 53 under this condition, only the portion of the liquid crystal layer 53 contacting the surface of the heat generating layer 44 has its dielectric constant changed. Thus, the change of dielectric constant (i.e., phase transition) of the whole memory cell is difficult to detect.

This drawback can be overcome by prolonging the heating time of the heat generating layer 44. However, the prolonged heating time causes the region at a high temperature to extend to the periphery thereof, resulting in the phase transition in the adjacent memory cells 43. Thus, a new drawback such as the difficulty in obtaining a memory cell with a high density comes up.

Considering the above, in the non-volatile memory using polymer liquid crystal, the distance between the two substrates 52 and 55 is set to be extremely small and the liquid crystal layer 53 is provided with a small thickness, whereby each memory cell 43 is uniformly heated.

On the other hand, the small distance between the substrates 52 and 55 (e.g., about several μm) makes the distance between the upper electrodes 41 and the counter electrode 51 extremely small. For this reason, the upper electrodes 41 and the counter electrode 51 are likely to be in contact with each other, resulting in frequent production of defective products. Thus, there has been a limit to the decrease in cost. Furthermore, in order for a liquid crystal material with high viscosity such as polymer liquid crystal to be uniformly injected into a small gap between the substrates 52 and 55, the liquid crystal material should be injected into the gap after its viscosity is decreased by heating or the liquid crystal material is injected thereto in a monomer state end thereafter polymerized. However, it is industrially difficult to inject the liquid crystal material at a high temperature. In the case where the liquid crystal material is polymerized after being injected into the gap, it is not likely to obtain a uniformly oriented liquid crystal layer.

Third, at present, limited kinds of polymer liquid crystal materials have been developed. Those developed materials have small anisotropy of dielectric constant. Because of this, the change of a dielectric constant due to the change of orientation from the poly-domain structure to the mono-domain structure or vice versa is small, making it difficult to read data.

Fourth, in the case where polymer liquid crystal is used, it is required that the orientation of liquid crystal molecules is set to a predetermined state. Conventionally, there have been the following two methods for setting the orientation state.

(i) Forming an orientation film on a substrate

An orientation film is formed on a substrate by coating an organic resin made of polyimide or the like onto a substrate and subjecting the resulting substrate to an orientation treatment such as rubbing or by diagonally vapor-depositing a silicon oxide or the like onto a substrate.

(ii) Applying a voltage to a liquid crystal layer

A liquid crystal material isotropically changes in phase when a temperature thereof goes up. If the temperature is decreased while applying a voltage to a liquid crystal layer made of the liquid crystal material under this condition, liquid crystal molecules therein are oriented in accordance with the direction of an electric field. Thus, the liquid crystal molecules can be oriented to a predetermined state by raising the temperature of the liquid crystal layer and then lowering the temperature while applying a voltage thereto in the course of the production of a device.

However, the above-mentioned two methods have the following problems.

(1) In the method for forming an orientation film, there is a problem regarding the reliability of the orientation film, when used at a high temperature. In addition, the step of forming the orientation film is added to a production process, increasing a cost. Furthermore, in the case where the orientation treatment such as rubbing is performed, static electricity is generated to damage a transistor or the like of a driving circuit used for heating a memory cell.

(2) In the method for applying a voltage to a liquid crystal layer, an orientation film is not necessary, but a high voltage needs to be applied. Moreover, the liquid crystal layer is fixed under the condition that the liquid crystal molecules are oriented. Thus, this method is difficult to realize.

SUMMARY OF THE INVENTION

According to one aspect of the invention, a non-volatile memory device includes: a substrate; a storage medium provided above the substrate; a writing means having a heating means provided above the substrate, for heating the storage medium by the heating means to write data in the storage medium with a thermal change of a physical value of the storage medium; and a reading means having an electrical reading means provided above the substrate, for reading the change of the physical value of the storage medium as data written in the storage medium by the electrical reading means.

In one embodiment of the invention, the electrical reading means comprises first paired electrodes formed of first electrodes and second electrodes, which cross and overlap each other; and wherein the heating means comprises second paired electrodes formed of the second electrodes and third electrodes which cross and overlap the second electrodes and exothermic bodies respectively inserted in an intersection of each second paired electrode.

In another embodiment of the invention, the first, second, and third electrodes are made of tungsten.

In still another embodiment of the invention, the substrate is made of silicon.

In still another embodiment of the invention, the storage medium comprises a liquid crystal compound or a compound containing a liquid crystal component in molecules thereof.

In still another embodiment of the invention, the storage medium is made of polymer liquid crystal.

In still another embodiment of the invention, the storage medium includes a polymer compound and liquid crystal droplets made of low molecular weight liquid crystal, the liquid crystal droplets being dispersed in the polymer compound.

In still another embodiment of the invention, the liquid crystal droplets are in a smectic phase at room temperature.

In still another embodiment of the invention, the liquid crystal droplets are in a nematic phase at room temperature.

In still another embodiment of the invention, the low molecular weight liquid crystal is changed in phase in the order of a crystal phase, a smectic phase, a nematic phase, and an isotropic phase with the increase in temperature.

In still another embodiment of the invention, the low molecular weight liquid crystal is changed in phase in the order of a crystal phase, a smectic phase, and an isotropic phase with the increase in temperature.

In still another embodiment of the invention, the low molecular weight liquid crystal is changed in phase in the order of a crystal phase, a nematic phase, and an isotropic phase with the increase in temperature.

According to another aspect of the invention, a non-volatile memory device includes: a substrate; a storage medium which is provided above the substrate and in which liquid crystal droplets made of low molecular weight liquid crystal are dispersed in a polymer compound; a writing means having a heating means provided above the substrate, for heating the storage medium by the heating means to write data in the storage medium with a thermal change of a physical value of the storage medium; and a reading means having an electrical reading means provided above the substrate, for reading the change of the physical value of the storage medium as data written in the storage medium by the electrical reading means.

In one embodiment of the invention, the heating means comprise paired electrodes formed of upper electrodes and lower electrodes which cross and overlap the upper electrodes and a heat generating layer disposed so as to be inserted in each intersection of the paired electrodes; wherein the electrical reading means comprises paired electrodes formed of the upper electrodes and a counter electrode provided on a counter substrate facing the substrate; and wherein the storage medium is sandwiched between the substrate and the counter substrate.

In another embodiment of the invention, the substrate is made of silicon.

In still another embodiment of the invention, the liquid crystal droplets are in a smectic phase at room temperature.

In still another embodiment of the invention, the liquid crystal droplets are in a nematic phase at room temperature.

In still another embodiment of the invention, the low molecular weight liquid crystal is changed in phase in the order of a crystal phase, a smectic phase, a nematic phase, and an isotropic phase with the increase in temperature.

In still another embodiment of the invention, the low molecular weight liquid crystal is changed in phase in the order of a crystal phase, a smectic phase, and an isotropic phase with the increase in temperature.

In still another embodiment of the invention, the low molecular weight liquid crystal is changed in phase in the order of a crystal phase, a nematic phase, and an isotropic phase with the increase in temperature.

According to still another aspect of the invention, a non-volatile memory device includes: a substrate; a storage medium which is provided above the substrate and which is made of a liquid crystal compound or a compound containing a liquid crystal component in molecules thereof; a writing means having a heating means provided above the substrate, for heating the storage medium by the heating means to write data in the storage medium with a thermal change of a physical value of the storage medium; and a reading means for optically reading data written in the storage medium.

According to still another aspect of the invention, a method for producing a non-volatile memory device, the device includes: a pair of substrates; a storage medium which is provided between the pair of substrates and in which liquid crystal droplets made of low molecular weight liquid crystal are dispersed in a polymer compound; writing means for heating the storage medium to write data in the storage medium with a thermal change of a physical value of the storage medium; and reading means for reading the change of the physical value of the storage medium as data written in the storage medium; the method comprising the steps of: sealing a mixture containing a UV-rays curable resin material and low molecular weight liquid crystal between the pair of substrates; and irradiating UV-rays to the mixture to polymerize the UV-rays curable resin material, thereby forming the storage medium.

The non-volatile memory device of the present invention will be described, in which three-layered electrodes (i.e., first electrode, second electrode, and third electrode) are formed in a matrix on one substrate.

The first electrodes, the second electrodes, and the third electrodes are positioned closer to the liquid crystal layer (storage medium) in this order. The first and second electrodes are in contact with the liquid crystal layer. The physical property of the liquid crystal layer is read by the respective first paired electrode constituted by the first electrode and the second electrode.

In such a structure, when a voltage is applied to one of the second paired electrodes (each constituted by the second electrode and the third electrode) disposed in a matrix to allow a current to flow through the heat generating layer inserted in the intersection of the second paired electrode, Joule heat is generated in the heat generating layer. By controlling the current, voltage, and voltage application time, the liquid crystal layer made of liquid crystal can be increased in temperature to such a degree that the state thereof is changed (i.e., phase transition thereof is caused). Thereafter, the application of a voltage is stopped to rapidly cool the liquid crystal layer. The liquid crystal layer is fixed with the state thereof changed. Because of this, the physical property of the liquid crystal layer, e.g., dielectric constant is changed, resulting in a data-written state. This state can be maintained for a long period of time, so that the written data can be stored as recorded data in a non-volatile manner.

The data recorded as the change of the dielectric constant of the liquid crystal layer can be electrically read by applying an AC voltage across the first and second electrodes and then measuring the electric capacitance of the liquid crystal layer which is a dielectric substance.

From this state, the liquid crystal layer is increased in temperature to such a degree that the state thereof is changed (i.e., phase transition thereof is caused). Thereafter, by controlling the current flowing through the heat generating layer and the voltage applied thereto via the second paired electrode, the liquid crystal layer is gradually cooled, or rapidly cooled while being applied with a high AC voltage. As a result, the liquid crystal layer is changed in phase again, whereby the data recorded therein can be erased. Accordingly, a rewritable non-volatile memory device using liquid crystal can be realized.

In the non-volatile memory device of the present invention, the storage medium is made of polymer dispersion liquid crystal (hereinafter, referred to as PDLC) in which liquid crystal droplete made of low molecular liquid crystal are dispersed in a polymer compound. When this storage medium is heated to such a degree that the orientation of the liquid crystal molecules in the liquid crystal droplets is changed, the physical property of the storage medium, such as a dielectric constant is changed. The change of the physical property means that data is written in the storage medium.

The recorded data can be read by an electrical reading method, such as measuring the electric capacitance of the storage medium.

When the following liquid crystal is used as the low molecular weight liquid crystal, the memory cell will have a satisfactory ability of storing data: liquid crystal which is changed in phase in the order of a crystal phase, a smectic phase, a nematic phase, and an isotropic phase with the increase in temperature, or which is changed in phase in the order of a crystal phase, a smectic phase, and an isotropic phase with the increase in temperature. The reason for this is that liquid crystal droplets which are in a smectic state at room temperature can be obtained.

In this case, by selecting the polymer compound and the low molecular weight liquid crystal so that they have a large interaction with each other, the memory cell will have a more satisfactory ability of storing data.

For producing the non-volatile memory device of the present invention, a mixture containing a UV-rays curable resin and a low molecular weight liquid crystal is coated onto one of a pair of substrates or sealing between a pair of substrates. Then, the mixture is irradiated with UV-rays, the storage medium is formed, in which the low molecular weight liquid crystal is dispersed in the polymer compound. Thus, unlike the case where polymer liquid crystal with high viscosity is sealed between a pair of substrates, it is not required to inject a liquid crystal material after the viscosity thereof is decreased by heating.

Thus, the invention described herein makes possible the advantage of providing a mass storage non-volatile memory device having a high density, capable of writing and reading data at a high speed, which enables a peripheral device to be miniaturized, simplified and cost-cut, and which can be produced by a simplified process, and a method for producing the non-volatile memory device.

This and other advantages of the present invention will become apparent to those skilled in the art upon reading and understanding the following detailed description with reference to the accompanying figures.

BRIEF DESCRIPTION OF THE DRAWINGS

FIG. 9(A–B) is a diagram showing the structure of a conventional magneto-optical disk.

FIG. 10 is a perspective view of a memory section constituting memory cells of a conventional non-volatile memory device.

DESCRIPTION OF THE PREFERRED EMBODIMENTS

Hereinafter, the present invention will be described by way of illustrative examples with reference to the drawings.

EXAMPLE 1

Figure 1:
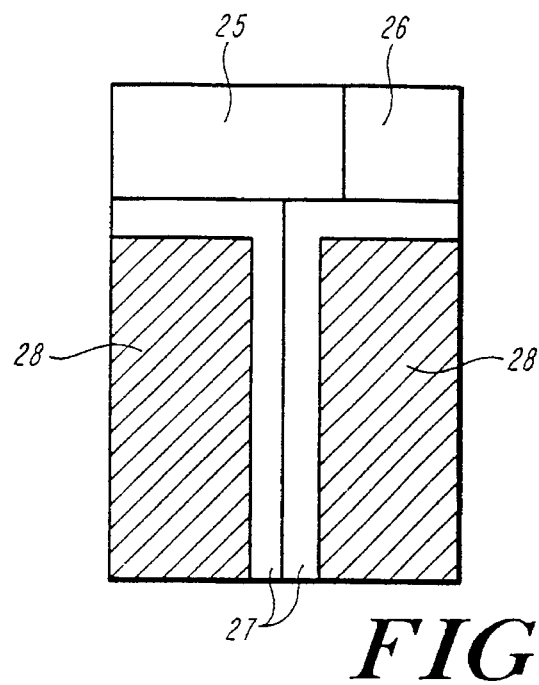
FIG. 1 is a schematic plan view showing the surface structure of a non-volatile memory device of Example 1 according to the present invention.
Figure 2:
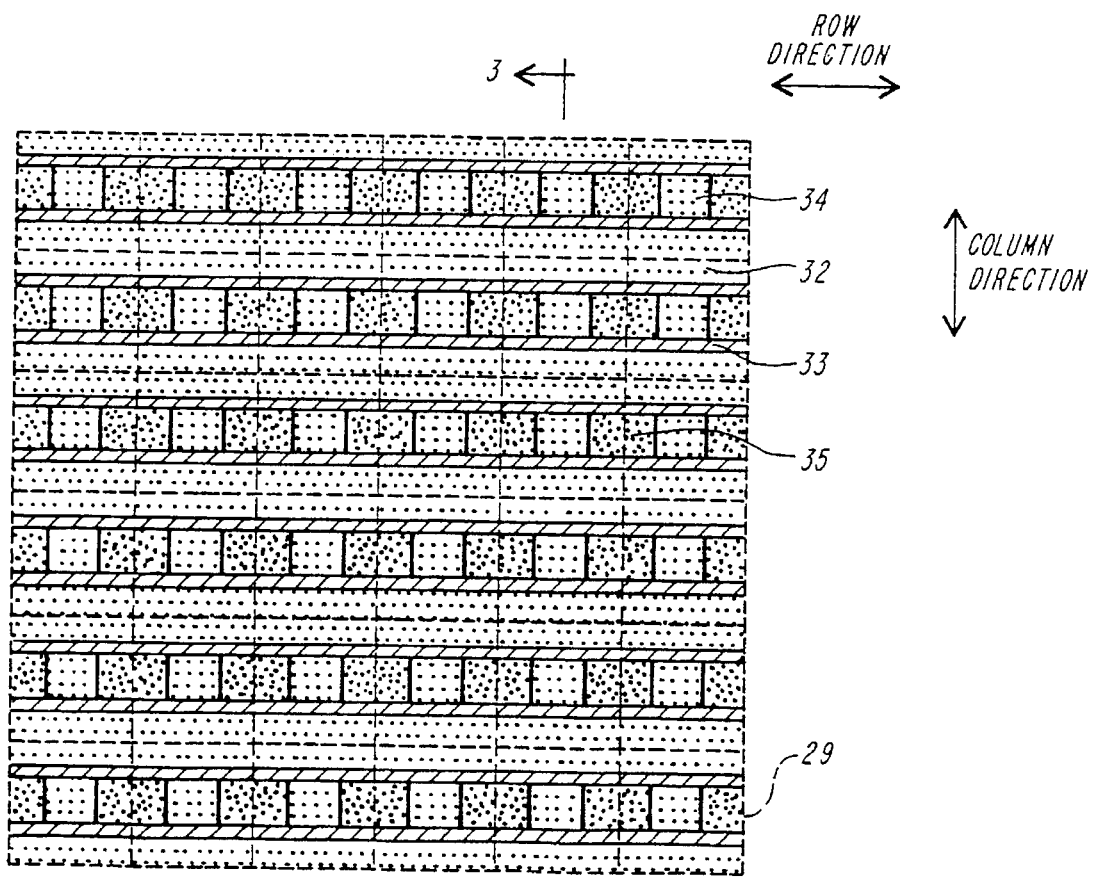
FIG. 2 is a schematic plan view showing the surface structure of a memory section of the non-volatile memory device shown in FIG. 1.
Figure 3:
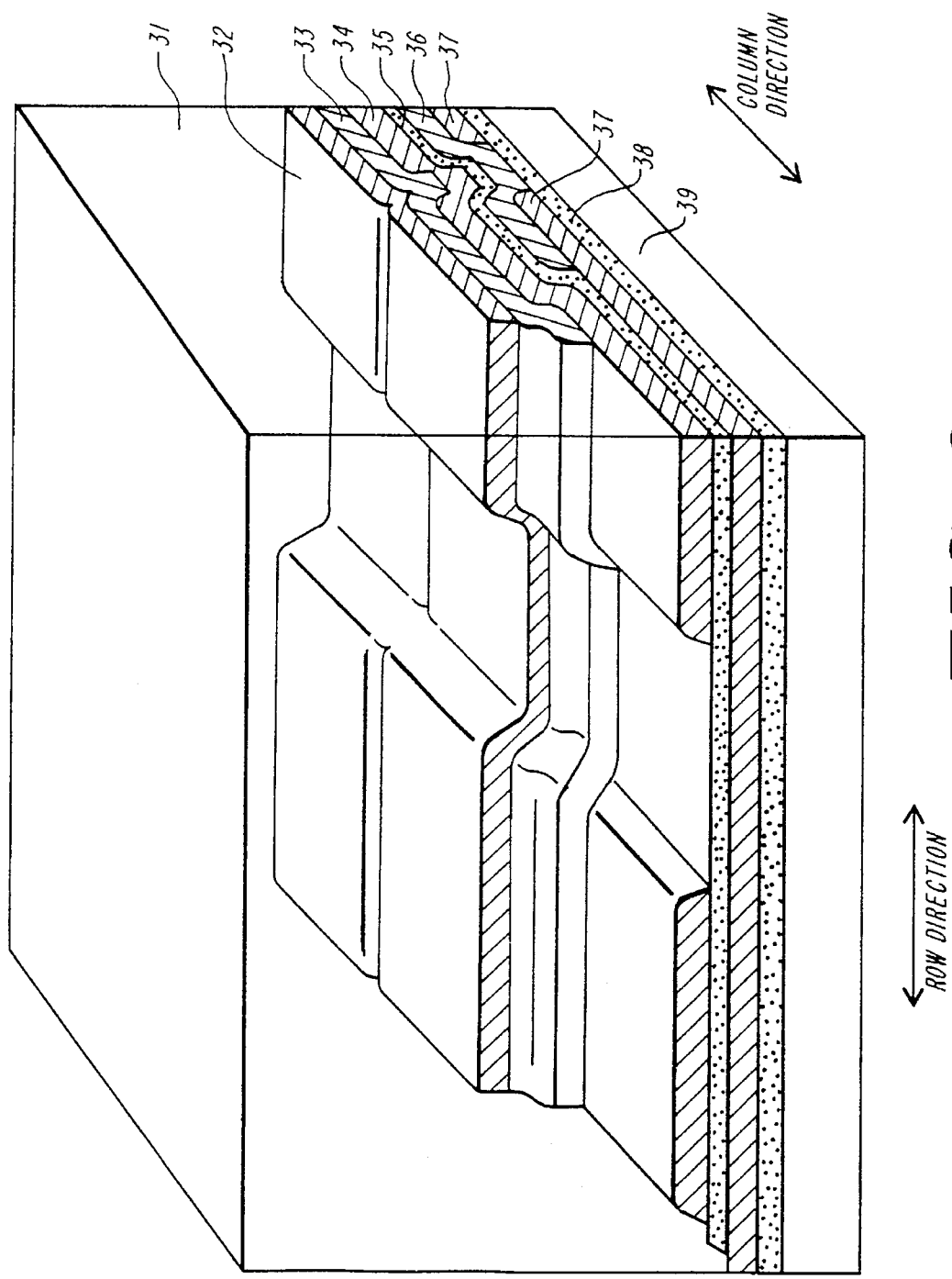
FIG. 3 is a perspective view of memory cells of the memory section shown in FIG. 2.
Figure 4:
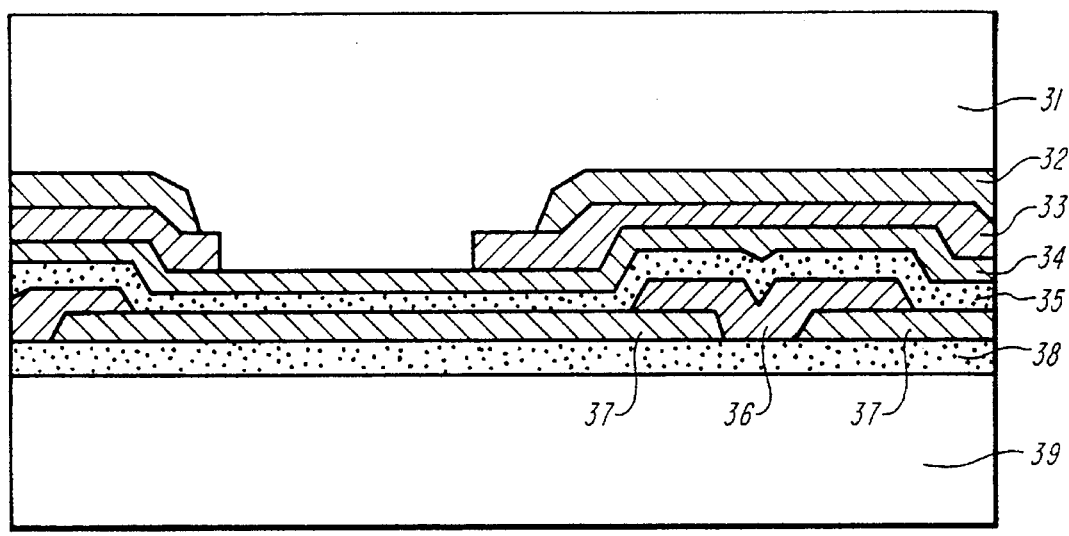
FIG. 4 is a cross-sectional view of the memory section taken along an 3—3 line shown in FIG. 2.

FIG. 1 schematically shows the surface structure of a non-volatile memory device of the present example. FIG. 2 is a plan view showing a memory section of the non-volatile memory device. FIG. 3 is a partial perspective view of the non-volatile memory device. FIG. 4 is a cross-sectional view taken along an A—A line of FIG. 2.

In FIG. 1, peripheral circuits of memory sections 28, such as an input/output signal control section 25, a logic control section 26, and driving circuit sections 27 are shown by blocks depending upon the respective functions. The input/output control section 25 has functions of processing an input signal from other devices such as an MPU to transmit the processed signal (data to be written) to a memory cell 29 (shown in FIG. 2), of processing a signal read by the memory cell 29 to transmit the processed signal to other devices, etc. The logic control section 26 controls a signal processing in the overall non-volatile memory device. The driving circuit section 27 receives a command from the logic control section 26 to conduct a current for supplying an electric signal to the memory cell 29 of the memory section 28. The memory section 28 stores a signal (data) supplied from the input/output signal control section 25 and keeps the signal as recorded data.

Such peripheral circuits are not limited to ICs. Any other circuits and circuit elements can be used, as long as they can be mounted on a silicon substrate.

As shown in FIGS. 2 to 4, each memory section 28 has a heat generating layer 35, first electrodes 32, second electrodes 34, third electrodes 37, a silicon substrate 39, and a liquid crystal layer 31. The heat generating layer 35 is provided between the second and third electrodes 34 and 37. The heat generating layer 35 generates heat used for writing or rewriting data in the memory cell 29. A current is supplied to the heat generating layer 35 by means of the second electrode 34 and the third electrode 37. The first electrode 32 work for reading recorded data in association with the second electrode 34.

Hereinafter, these elements will be described in more detail.

FIG. 2 shows the surface structure of the silicon substrate 39 excluding the liquid crystal layer 31. As shown in this figure, a plurality of first electrodes 32, each extending in a row direction, are disposed at an equal distance from each other in a column direction. The first electrodes 32 are in contact with the liquid crystal layer 31 provided thereover. Below the first electrodes 32, a plurality of second electrodes 34, each extending in the column direction, are disposed at an equal distance from each other in the row direction. The first electrodes 32 cross the second electrodes 34 at a right angle. The respective first and second electrodes 32 and 34 form first paired electrodes.

Intersections (i.e., first paired electrodes) of the first electrodes 32 and the second electrodes 34 are provided in a matrix above the silicon substrate 39. The respective first paired electrode constituted by the first and second electrodes 32 and 34 is used for reading data recorded in the memory cell 29. The second electrodes 34 are also in contact with the liquid crystal layer 31 thereover. The memory cells 29 are also provided in a matrix. The memory cells 29 constitute each of the memory sections 28. In FIG. 2, a region surrounded by a broken line corresponds to one of the memory cells 29.

Below the second electrodes 34, a plurality of third electrodes 37, each extending in the row direction, are disposed at an equal distance from each other in the column direction. Thus, intersections (i.e., second paired electrodes) constituted by the second and third electrodes 34 and 37 are provided in a matrix. The second electrodes 34 and the third electrodes 37 are electrically connected to each other via the heat generating layer 35, whereby an electric power is supplied to the heat generating layer 35.

In the present example, for the purpose of setting the size of each memory cell 29 to be small, tungsten, which is excellent in heat-resistance, is used as a material for the respective first, second, and third electrodes 32, 34, and 37. In the present example, the first electrode 32 has a width of about 1 μm, the second electrode 34 about 1 μm, and the third electrode 37 about 1.5 μm; and the memory cell 29 has an area of about 2 μm×2 μm.

Each memory portion is composed of the intersection of the second electrode 34 and the third electrode 37 and the liquid crystal layer 31 provided above the intersection. The liquid crystal layer 31 records data using a phase transition phenomenon thereof.

Referring to FIGS. 3 and 4, the exemplary structure of the memory cell 29 will be described.

The silicon substrate 39 is a single crystal silicon substrate generally used in an IC. In the silicon substrate 39, impurities are doped so as to control resistance. The silicon substrate 39 is covered with a field insulating film 38, and the third electrodes 37 are formed on the field insulating film 38. This structure prevents a drive current flowing between the second electrode 34 and the third electrode 37 from leaking into the silicon substrate 39.

Between the second electrodes 34 and the third electrodes 37, an inter-electrode insulating film 36 is formed so as to keep insulation therebetween. In the present example, a silicon nitride film formed by a plasma CVD method is used as the interelectrode insulating film 36. This is because a homogeneous film quality without pores and homogeneous film thickness of the inter-electrode insulating film 36 are required for preventing dielectric breakdown in the case where a voltage of 10 V or more is applied across the second electrode 34 and the third electrode 37.

The inter-electrode insulating film 36 has an opening at each memory portion in which data is recorded, where the heat generating layer 35 is directly sandwiched between the second electrode 34 and the third electrode 37. In the present example, the second electrode 34 and the third electrode 37 are made of tungsten by a reduced-pressure CVD method. The reason for this is as follows: When data is written or erased, a voltage is applied across the second electrode 34 and the third electrode 37. As a result, a current flows through the heat generating layer 35 to generate Joule heat therein. The heat generation of the heat generating layer 35 causes the temperature of the second electrode 34 and the third electrode 37 to increase. Thus, the material for the second electrode 34 and the third electrode 37 is required to be a heat-resistant material such as tungsten. On the other hand, the heat generating layer 35 is made of polycrystalline silicon with high purity formed by a CVD method. This is because the heat generating layer 35 is required to be made of a heat-resistant material which has appropriate resistance and which can be minutely processed.

In the present example, tungsten is used for the electrode material. Other materials can be used, as long as they are heat-resistant. Also, a method for forming the electrodes are not limited to the CVD method. Other methods can be used, as long as the electrodes can be uniformly formed.

Next, an exemplary process for producing the memory cells 29 formed in a matrix on each memory section 28 will be described.

As for the non-volatile memory device of the present invention, a step of forming a peripheral metal oxide semiconductor (MOS) IC and a step of forming the memory sections 28 are required. However, for simplicity of the description, only the process for producing the memory cells 29 will be described here. As the MOS IC process, a known process for producing an IC is used.

As the silicon substrate 39, a 6-inch P-type (100) single crystal silicon wafer is used. First, the field insulating film (field oxide film) 38 having a thickness of 800 nm is formed on the silicon substrate 39 by thermal oxidation. Then, on the field insulating film 38, a tungsten film having a thickness of 1.2 μm is formed by a reduced-pressure CVD method. Unwanted portions of the tungsten film are removed by photolithography and dry etching to pattern the third electrodes 37.

Thereafter, a silicon nitride film having a thickness of 1.0 μm is provided on the third electrodes 37 by a plasma CVD method, thereby forming the inter-electrode insulating film 36 insulating the third electrodes 37 from the second electrodes 34. Openings are formed in the inter-electrode insulating film 36 by photolithography and dry etching so as to reach the third electrodes 37.

Next, a polycrystalline silicon film having a specific resistance of about 1000 Ω·cm and a thickness of about 1.0 μm is formed over the entire surface of the silicon substrate 39 by a reduced-pressure CVD method so as to cover the third electrodes 37 and the inter-electrode insulating film 36. Thus, the heat generating layer 35 are formed. In the present example, the heat generating layer 35 is formed by a reduced-pressure CVD method, using a monosilane gas with high purity as a material for preparing polycrystalline silicon. If impurities such as boron, phosphorus, and metal are mixed in the polycrystalline silicon film, the resistance value thereof is decreased and in some cases, the film does not reach a predetermined temperature even upon generating heat. Thus, in particular, care should be given to the purity of the material to be used for a CVD method and the cleaning of the device. However, as long as the required resistance value can be kept, other silicon compounds and other methods for forming the heat generating layer 35 can be used.

Next, a tungsten film having a thickness of about 1.0 μm is formed so as to cover the heat generating layer 35 by a reduced-pressure CVD method. Thereafter, unwanted portions of the tungsten film are removed by photolithography and dry etching to form the second electrodes 34.

A silicon nitride film having a thickness of 5.0 μm is provided so as to cover the second electrodes 34 by a plasma CVD method, thereby forming inter-electrode insulating film 33 insulating the first electrodes 32 from the second electrodes 34. Then, openings are formed in the inter-electrode insulating film 33 by photolithography and dry etching so as to reach the second electrodes 34. The inter-electrode insulating film 33 preferably has large thickness because of a low dielectric constant thereof. By doing so, the inter-electrode insulating film 33 has its dielectric constant greatly changed due to the phase transition of the liquid crystal layer 31 and reading data becomes easy.

A tungsten film having a thickness of about 1.0 μm is formed so as to cover the inter-electrode insulating film 33 by a reduced-pressure CVD method. Unwanted portions of the tungsten film are removed by photolithography and dry etching to form the first electrodes 32.

Onto the silicon substrate 39 produced as described above, polyacrylate type nematic liquid crystal containing p-cyanobiphenyl as a mesogenic group is uniformly coated to a thickness of 1 to 10 μm, thereby forming the liquid crystal layer 31. Thereafter, the liquid crystal layer 31 is isotropically and gradually cooled while applying an AC voltage of 100 V and 50 Hz across the first electrode 32 and the second electrode 34. Thus, the liquid crystal molecules in the liquid crystal layer 31 assumes a homeotropic structure. As the liquid crystal material, other materials can be used as long as they change in phase transition by heating and can maintain the changed condition.

In the present example, each memory cell 29 is formed by coating the liquid crystal layer 31 onto the silicon substrate 39 provided with the required components. Alternatively, glass which is cut into an appropriate size and the silicon substrate 39 are attached to each other with a gap of 1 to 10 μm therebetween, and then polymer liquid crystal is injected therebetween, whereby the memory cell 29 can be formed.

In the non-volatile memory device of the present invention, in addition to the polymer liquid crystal containing p-cyanobiphenyl as a mesogenic group, polycyloxane type polymer smectic liquid crystal can be used in the same manner.

Furthermore, as the liquid crystal material, other conductive polymer liquid crystal can be used. In this case, ester type conductive polymer liquid crystal is coated onto the silicon substrate. The polyacrylate type conductive polymer liquid crystal has an ester type liquid crystal as a mesogenic group and a charge transfer complex, which contains phenathrene (electron donor) and iodine (electron acceptor), as a group providing conductivity. The conductive polymer liquid crystal is isotropically and gradually cooled while being applied with an AC voltage of 100 V and 500 Hz, whereby the liquid crystal molecules are oriented.

Finally, the silicon substrate 39 thus produced is diced, subjected to bonding, and packaged.

Next, the principle of writing and reading data in the memory cell 29 will be described.

In the non-volatile memory device of the present invention, data is recorded in the memory cell 29 using the change in state of liquid crystal due to heating (i.e., phase transition) and recorded data is read using the change in dielectric constant caused by the change in state of the liquid crystal. In the polyacrylate type nematic liquid crystal containing p-cyanobiphenyl as a mesogenic group, polycyloxane type polymer smectic liquid crystal, etc., the liquid crystal molecules are changed to an isotropical phase by heating at a temperature not less than a phase transition temperature. When the liquid crystal is rapidly cooled after heating, the structure thereof is changed from a mono-domain structure to a poly-domain structure. The poly-domain structure can be maintained for a long period of time at room temperature.

Thus, in such a storage medium, recorded data can be kept in a non-volatile manner.

On the other hand, when the liquid crystal is gradually cooled after heating, the liquid crystal returns to a mono-domain structure after becoming a poly-domain structure. Since the dielectric constant of the mono-domain structure is different from that of the poly-domain structure, recorded data can be electrically read using this difference.

Hereinafter, the exemplary operation of writing or rewriting data in the non-volatile memory device of the present invention will be described.

Method for writing or rewriting data

Data input from an external device is once recorded in a buffer memory in the input/output control section 25. The data is written in the memory cell 29 of the memory section 28 after being processed. The data is written by applying a voltage to the heat generating layer 35 inserted in the intersection of the second electrode 34 and the third electrode 37, thereby heating the liquid crystal layer 31. After the liquid crystal layer 31 is heated, the application of a voltage is stopped and the liquid crystal layer 31 is rapidly cooled. The liquid crystal molecules therein assumes a poly-domain structure, that is, the liquid crystal layer 31 is in a data-written condition. This poly-domain structure corresponds to data "1". On the other hand, when a voltage is gradually lowered to gradually cool the liquid crystal layer 31, the liquid crystal molecules therein assumes a mono-domain structure, that is, the liquid crystal layer 31 is in a data-erased condition. This mono-domain structure corresponds to data "0". The change to the mono-domain structure can be realized by applying an electric field across the first electrode 32 and the second electrode 34, and then cooling the liquid crystal layer 31.

In the non-volatile memory device of the present invention, since the write position can be freely selected, a random access is made possible.

Method for reading data

An AC voltage is applied across the first electrode 32 and the second electrode 34, under which an electric capacitance of the liquid crystal layer 31 is measured. Since the dielectric constant of the mono-domain structure is different from that of the poly-domain structure, the mono-domain structure is discriminated against the poly-domain structure based on the difference between the respective electric capacitances. This makes possible reading data "1" and "0".

In the present example, data written in the memory cell 29 is electrically read by applying an AC voltage across the first electrode 32 and the second electrode 34. Reading data can also be optically performed.

The liquid crystal layer 31 having a mono-domain structure is in a transparent state, while the liquid crystal layer 31 having a poly-domain structure is in an opaque state because of light scattering. Thus, a laser beam or the like is irradiated to the memory cell 29, and light reflected from the memory cell 29 is detected by a photodetector, whereby recorded data can be read. According to this method for reading data, since the surface of the liquid crystal layer 31 is required to be flat, a transparent layer such as glass should be disposed on the surface of the liquid crystal layer 31 so as to improve reading precision.

The non-volatile memory device having such a structure needs a photodetector. Therefore, compared with the electrical data-reading unit as described above, data can be read with better precision even though a system itself becomes larger. However, in the case of this system, an electrical device having a signal processing unit is required so that this system can also be considered as an electrical system.

As described above, at the time of writing data, the non-volatile memory device of the present example uses the change in orientation of liquid crystal molecules present on the surfaces of the first and second electrodes 32 and 34, instead of using the change in orientation of liquid crystal molecules in the thickness direction of the liquid crystal layer 31. This is because it is difficult to uniformly heat the whole liquid crystal layer 31, as is apparent from the above-mentioned results of thermal analysis. On the contrary, the surface portion of the liquid crystal layer 31 which is in contact with the first and second electrodes 32 and 34 in the vicinity of the heat generating layer 35 can be relatively easily increased in temperature. Therefore, by using the change in orientation of the liquid crystal molecules present on the surfaces of the first and second electrodes 32 and 34, data can be rapidly recorded.

As described above, according to the non-volatile memory device of the present invention, there are the following advantages:

Data is written in a storage medium and is read therefrom by electrostatic control, so that transportation mechanisms such as a rotary mechanism and a head are not required as in magneto-optical disks and magnetic disks. Thus, miniaturized, simplified, and cost-cut structure of the device can be obtained.

In addition, since portions with a complicated and precision structure which are required for a laser pickup, a magnetic head, etc. are not necessary. Therefore, there is no possibility that the device is damaged due to the vibration, impact, and adhesion of dirts. Consequently, the stability of holding data and the reliability of the device can be remarkably improved.

Moreover, the structure of a memory cell is much more simplified, compared with the non-volatile memory device using an IC non-volatile memory. Therefore, a memory cell with a large area can be realized.

Furthermore, the first and second electrodes 32 and 34 (which are used for reading data), and the heat generating layer 35 (which is a heating unit) are provided on one substrate 39. That is, all of the structural elements such as the liquid crystal layer 31 as a storage medium and peripheral circuits composed of ICs, which controls the write and read of data, are provided on one substrate. This makes the structure of the overall memory device simplified. A counter electrode is not required, which makes it possible to coat a liquid crystal material as a storage medium onto the substrate. All of the wirings are conducted on one substrate; therefore, a non-volatile memory device can be produced by the combination of thin film formation, photolithography, and dry etching, and electrodes can be easily lead out. Thus, the device can be miniaturized, simplified, and cost-cut.

Since data is written by means of the storage medium in the vicinity of the surface of the heat generating layer which is a heating unit, the efficiency for using heat at the time of writing data is increased. That is, the liquid crystal of the storage medium is effectively changed in phase.

In particular, if the first, second, and third electrodes 32, 34 and 37 are made of tungsten, the size of each memory cell can be made small and a non-volatile memory device with a larger storage capacity and higher density can be realized.

Also, in particular, the substrate is made of silicon, minute IC processing technologies can be applied, so that minute memory cells can be realized. Thus, in this respect, a non-volatile memory device with a larger storage capacity and higher density can be realized.

In this way, according to the present invention, a novel type non-volatile memory device provided with desired conditions for non-volatile memory devices is realized.

EXAMPLE 2

Figure 5:
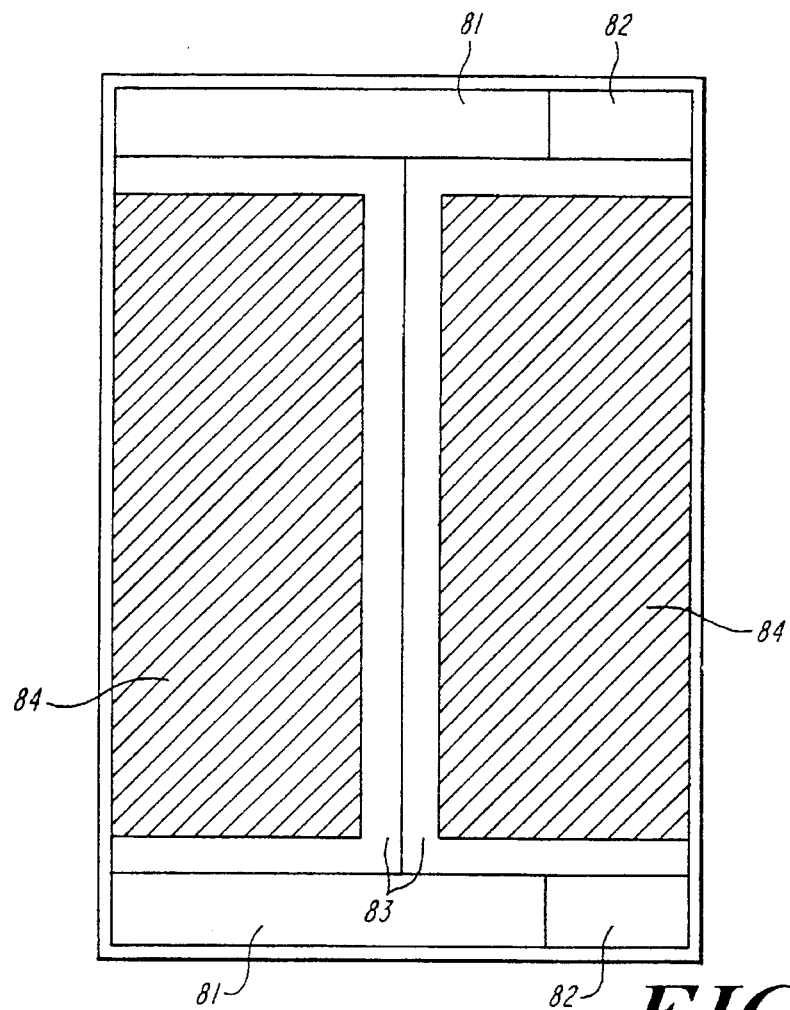
FIG. 5 is a schematic plan view showing the surface structure of a non-volatile memory device of Example 2 according to the present invention.
Figure 6:
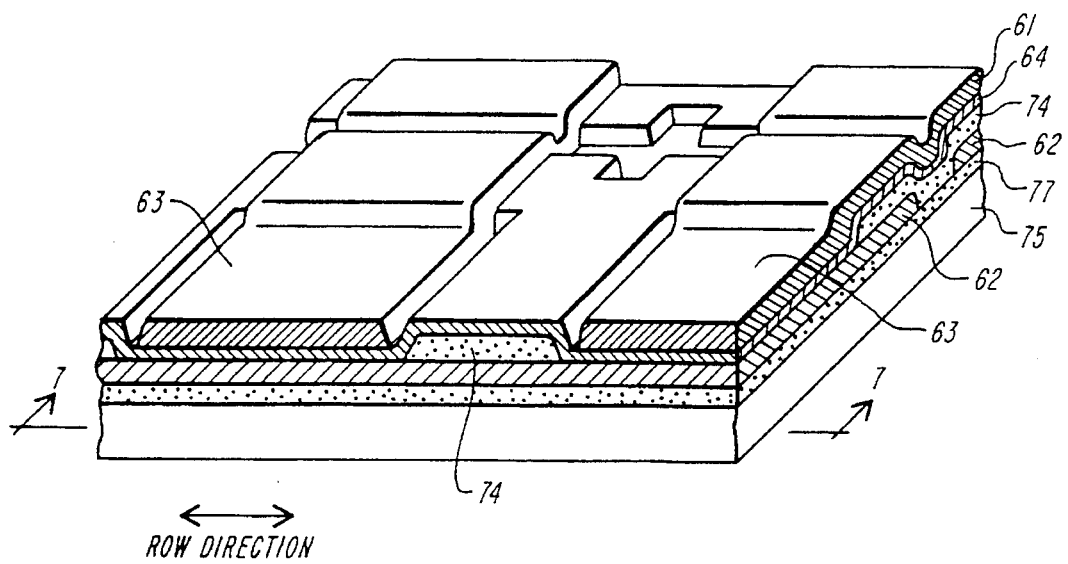
FIG. 6 is a perspective view of a memory section constituting memory cells of the non-volatile memory device shown in FIG. 5.
Figure 7:
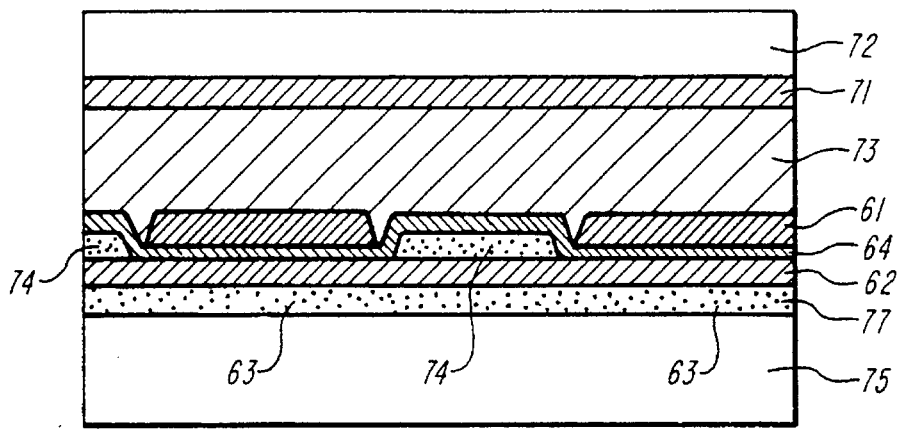
FIG. 7 is a cross-sectional view of the memory section taken along an 7—7 line shown in FIG. 6.
Figure 8:
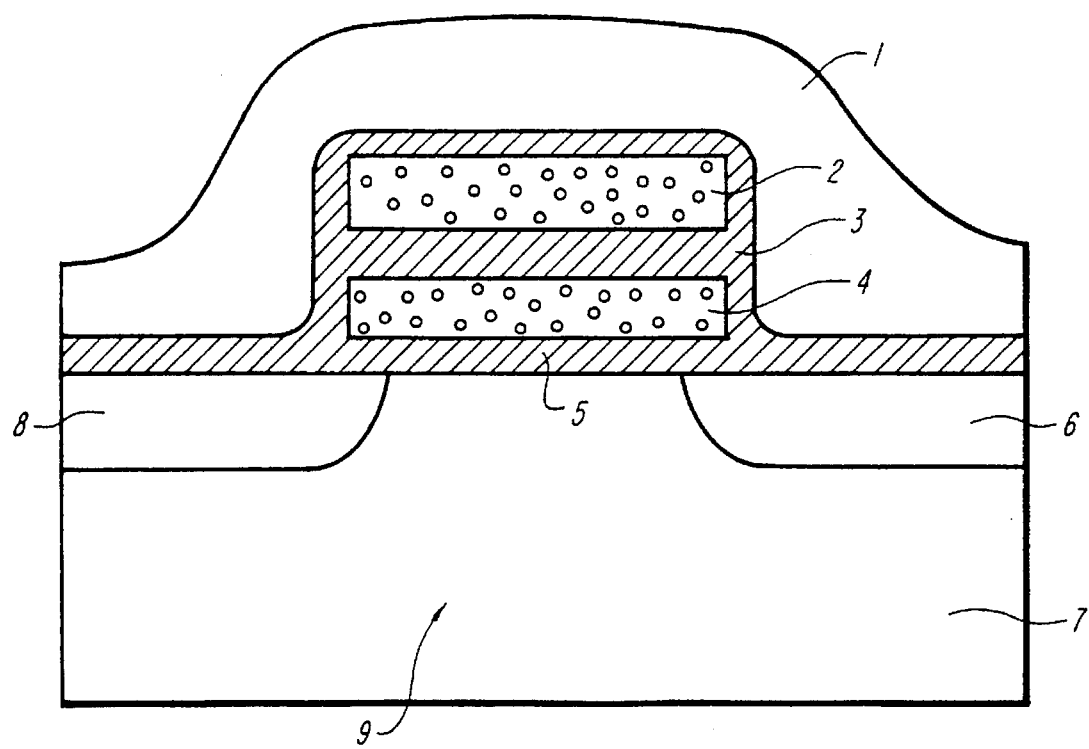
FIG. 8 is a cross-sectional view showing the structure of a conventional EEPROM.
Figure 11:
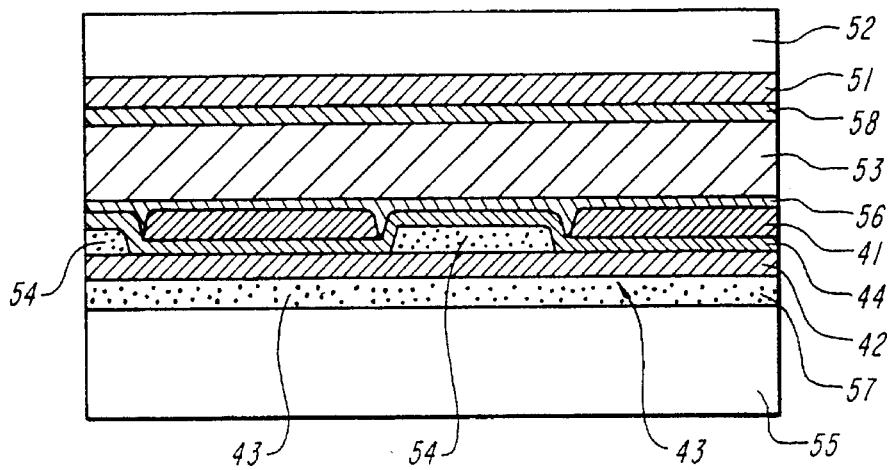
FIG. 11 is a cross-sectional view of the memory section taken along a 11—11 line shown in FIG. 10.
Figure 12:
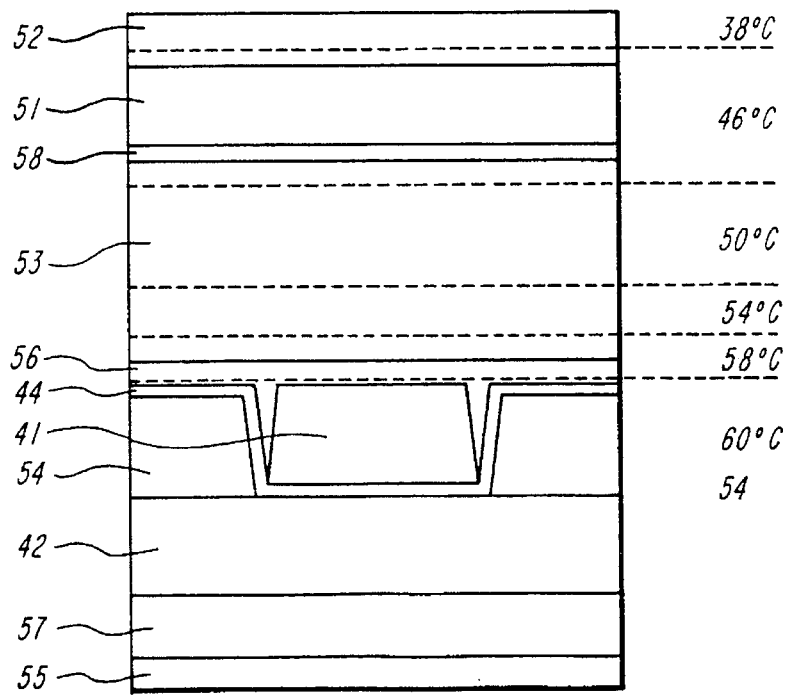
FIG. 12 is a cross-sectional view of a computer simulation showing the analysis of heat diffusion in the non-volatile memory device using liquid crystal.

FIG. 5 schematically shows the surface structure of a non-volatile memory device of the present example. FIG. 6 is a partial perspective view of a memory section of the non-volatile memory device. FIG. 7 is a cross-sectional view taken along an A—A line of FIG. 6.

In FIG. 5, peripheral circuits of memory sections 84, such as input/output signal control sections 81, logic control sections 82, and drive circuit sections 83 are shown by blocks depending upon the respective functions. The input/output signal control section 81 has functions of processing an input signal from other devices such as an MPU to transmit the processed signal (data to be written) to a memory cell, of processing a signal read by the memory cell to transmit the processed signal to other devices, etc. The logic control section 82 controls a signal processing in the overall non-volatile memory device. The drive circuit section 83 receives a command from the logic control section 82 to conduct a current for supplying an electric signal to the memory cell of the memory section 84. The memory section 84 stores a signal (data) supplied from the input/output signal control sections 81 and keeps the signal as recorded data.

As shown in FIG. 7, each memory section 84 has a PDLC layer 73 instead of a polymer liquid crystal layer. The PDLC layer 73 is sandwiched between substrates 72 and 75, and upper and lower electrodes 61 and 62 are provided in a matrix between the substrates 72 and 75.

As shown in FIGS. 6 and 7, a plurality of first electrodes 62, each extending in a row direction, are disposed above the substrate 75 at an equal distance from each other in a column direction. Above the lower electrodes 62, a plurality of upper electrodes 61, each extending in the column direction, are disposed at an equal distance from each other in the row direction. Between the upper electrodes 61 and the lower electrodes 62, a heat generating layer 64 for writing and reading data is provided. The respective intersection of the upper electrode 61 and the lower electrode 62 corresponds to a memory portion in which data is recorded.

The substrate 75 is a single crystal silicon substrate generally used in an IC. In the silicon substrate 75, impurities are doped so as to control resistance. The substrate 75 is covered with a field insulating film 77, and the lower electrodes 62 are formed on the field insulating film 77. This structure prevents a drive current flowing between the upper electrode 61 and the lower electrode 62 from leaking into the substrate 75.

Between the respective adjacent upper electrodes 61 and between the respective adjacent lower electrodes 62, an inter-electrode insulating film 74 is formed. In the present example, a silicon nitride film formed by a plasma CVD method is used as the inter-electrode insulating film 74. This is because a homogeneous film quality without pores and homogeneous film thickness are required for preventing dielectric breakdown in the case where a voltage of 10 V or more is applied across the upper electrode 61 and the lower electrode 69.

The inter-electrode insulating film 74 has an opening at each memory portion, where the heat generating layer 64 is directly sandwiched between the upper electrode 61 and the lower electrode 69-. In the present example, the upper electrode 61 and the lower electrode 62 are made of tungsten by a reduced-pressure CVD method. The reason for this is as follows: When data is written or erased, a voltage is applied across the upper electrode 61 and the lower electrode 62. As a result, a current flows through the heat generating layer 64 to generate Joule heat therein. The heat generation of the heat generating layer 64 causes the temperature of the upper electrode 61 and the lower electrode 62 to increase. Thus, the material for the upper electrode 61 and the lower electrode 62 is required to be a heat-resistant material such as tungsten. On the other hand, the heat generating layer 64 is made of polycrystalline silicon with high purity formed by a CVD method. This is because the heat generating layer 64 is required to be made of a heat-resistant material which have appropriate resistance and which can be minutely processed.

In the present example, tungsten is used for the electrode material. Other materials can be used, as long as they are heat-resistant. Also, a method for forming the electrodes are not limited to the CVD method. Other methods can be used, as long as the electrodes can be uniformly formed.

The substrate 72 is made of glass and the entire surface thereof is covered with a counter electrode 71.

The substrates 72 and 75 are attached to each other with a predetermined gap (not more than 50 μm, preferably 1 μm) therebetween, and the PDLC layer 73 is inserted therebetween.

The PDLC layer 73 has a structure in which liquid crystal droplets made of low molecular weight liquid crystal are dispersed in a polymer compound. As for the PDLC layer 73, the orientation of the liquid crystal molecules in the liquid crystal droplets is determined by walls of the polymer compound surrounding the liquid crystal droplets. Thus, it is not required to form an orientation film such as that used in the case of polymer liquid crystal. Also, since the non-orientation state of the liquid crystal molecules immediately after the formation of the liquid crystal droplets is almost the same as that of the liquid crystal molecules at the time of heating, followed by cooling, it is not required to orient the liquid crystal molecules after the formation of the liquid crystal droplets.

As the low molecular weight liquid crystal, any liquid crystal can be used, as long as it is compatible with the polymer compound. Examples of the low molecular weight liquid crystal include fluorine liquid crystal having large anisotropy of dielectric constant, liquid crystal which is in a nematic phase or in a smectic phase at room temperature, etc. Also, as the low molecular weight liquid crystal, liquid crystal which is changed in phase in the order of a crystal phase, a smectic phase, a nematic phase, and an isotropic phase with the increase in temperature; liquid crystal which is changed in phase in the order of a crystal phase, a smectic phase, and an isotropic phase with the increase in temperature; and liquid crystal which is changed in phase in the order of a crystal phase, a nematic phase, and an isotropic phase with the increase in temperature can be used.

Examples of the material for the polymer compound include materials which can be polymerized upon heating or irradiation of light, such as a mixture of β-(perfluorooctyl)ethylacrylate, isobornyl acrylate, and TMPT-A (trimethylolpropane triacrylate).

The PDLC layer 73 has an ability of storing data under a certain orientation of liquid crystal molecules contained therein. For example, liquid crystal which is in a smectic phase at room temperature does not have its orientation of liquid crystal molecules changed, unless a voltage and heat at a predetermined value or more is applied. Also, liquid crystal which is in a nematic phase at room temperature will have a higher ability of storing data, if the liquid crystal largely interacts with the polymer compound.

The process for producing the non-volatile memory device will be described.

First, the inter-electrode insulating film 77 is formed on the substrate 75. On the inter-electrode insulating film 77, the lower electrodes 62, the heat generating layer 64, the upper electrodes 61, etc. are formed. On the other hand, the counter electrode 71 is formed on the substrate 72. The heat generating layer 64 and the upper and lower electrodes 61 and 62 are formed in the same manner as described in Japanese Patent Application No. 3-138027.

Next, the substrates 72 and 75 are faced to each other so that the respective surfaces having electrodes are inside and the counter electrode 71 on the substrate 72 is positioned above the memory cells 63 on the substrate 75. Under this condition, the peripheries of the memory sections 84 are sealed.

Thereafter, the PDLC layer 73 is formed in the gap between the substrates 72 and 75. The PDLC layer can be formed by any methods such as follows:

(1) Liquid crystal droplets encapsulated with a polymer capsule are formed in the gap between facing two substrates. (Japanese Laid-Open Patent Publication No. 58-501631).

(2) A solution, which is obtained by dissolving a polymer material and a liquid crystal material in a single solvent, is coated onto one substrate, followed by drying to remove the solvent. Thereafter, the other substrate is attached to the resulting substrate. (Japanese Laid-Open Patent Publication No. 59-226322).

(3) A mixture containing a polymerizable material and a liquid crystal material is sealed between the facing substrates and the polymerizable material in the mixture is polymerized to be cured upon irradiation of UV-rays. (Japanese Laid-Open Patent Publication No. 61-502128).

In the present example, the PDLC layer 73 is formed as follows:

A monomer material for the polymer compound, low molecular weight liquid crystal, and a polymerization initiator are mixed so that each component is compatible state. In this case, all of the components in this mixture have a low molecular weight. Therefore, the mixture has low viscosity and can be treated in the same way as in general liquid crystal.

Then, the mixed solution in a compatible state is injected into the gap between the substrates 72 and 75 at room temperature. The monomer in the mixed solution is polymerized upon irradiation of UV-rays of 350 to 400 nm in the case where the monomer is a photo-polymerizable monomer. Alternatively, the monomer in the mixed solution is polymerized upon heating in the case where the monomer is a heat-polymerizable monomer. As a result of the polymerization of the monomer, a polymer matrix made of the polymer compound is formed. At this time, the low molecular weight liquid crystal is phase-separated from the polymer matrix, so that the low molecular weight liquid crystal droplets surrounded by the polymer matrix are formed, resulting in the PDLC layer 73.

The behavior of the PDLC layer 73 produced as described above will be described using the case where low molecular weight liquid crystal which is a smectic phase at room temperature is used.

At room temperature, the liquid crystal molecules in the liquid crystal droplets are in a smectic phase in which liquid crystal molecules are randomly oriented, depending upon each liquid crystal droplet. When the PDLC layer 73 is heated, the liquid crystal molecules in each liquid crystal droplet are changed in phase in the order of a smectic phase, a nematic phase, and an isotropic phase.

When the PDLC layer 73 is cooled under the condition that the liquid crystal droplets are in an isotropic phase, the liquid crystal molecules in each liquid crystal droplet are changed in the order of an isotropic phase, a nematic phase, and a smectic phase. The orientation of the liquid crystal molecules is different, depending upon each liquid crystal droplet. Thus, the liquid crystal molecules are randomly oriented, when the PDLC layer 73 is seen as a whole.

However, in the case where the temperature of the PDLC layer 73 is lowered while applying a voltage thereto, the behavior of the PDLC layer 73 is as follows:

When the PDLC layer 73 is applied with an electric field while the liquid crystal molecules in each liquid crystal droplet are in a nematic phase, the liquid crystal molecules are oriented in each liquid crystal droplet, in accordance with the direction of an electric field. However, when the application of an electric field is stopped under the condition that the liquid crystal molecules are still in a nematic phase, the orientation of the liquid crystal molecules returns to the state before being applied with an electric field (i.e., a nematic state in which the liquid crystal molecules are randomly oriented, depending upon each liquid crystal droplet). This shows the liquid crystal molecules in a nematic phase have a lower ability of storing data.

When the PDLC layer 73 is changed in phase to a smectic phase by further lowering the temperature thereof under the condition that an electric field is applied to the PDLC layer 73, the PDLC layer 73 becomes a smectic phase with the liquid crystal molecules therein oriented in the direction of the electric filed. In the smectic phase, the liquid crystal molecules have lower mobility, compared with that in the nematic phase, and have a layered structure. Because of this, even though the application of an electric field is stopped under the condition that the liquid crystal molecules are in a smectic phase, the liquid crystal molecules are still oriented in each liquid crystal droplet in the direction of an electric field, while maintaining a smectic phase. This shows that the liquid crystal molecules in a smectic phase have a higher ability of storing data.

As is understood from above, when a low molecular weight liquid crystal material, which is in a smectic phase at room temperature and becomes a nematic phase or an isotropic phase upon heating, is used, a storage medium having a high ability of storing data can be obtained. Moreover, in the case where the PDLC layer 73 in an isotropic phase is cooled, even a liquid crystal material, which is not changed from an isotropic phase to a nematic phase but is directly changed from an isotropic phase to a smectic phase, can be used.

In the case where a low molecular weight liquid crystal material which is in a nematic phase at room temperature is used, the interaction between the low molecular weight liquid crystal material and the polymer walls surrounding the liquid crystal droplets can increase the ability of the liquid crystal molecules of storing data. Thus, it is preferred that the material for the polymer compound has a large interaction with the low molecular weight liquid crystal material.

More specifically, as the monomer material for the polymer compound, a monomer mixture containing 0.02 g of TMPT-A (trimethylolpropane triacrylate), 0.03 g of β-(perfluorooctyl)ethylacrylate, and 0.15 g of isobornyl acrylate is used. As the low molecular weight liquid crystal, 0.78 g of K24 single liquid crystal (4-cyano-4'-n-octylbiphenyl, TSN: 43° C., $T_{NI}$: 40° C., manufactured by BDH corporation) is used. As the polymerization initiator using UV-rays, 0.03 g of Irgacure 651 (manufactured by CIBA-GEIGY Corporation) is used. In this combination, each component becomes compatible at about 15° C. or more. This mixed solution is injected into a gap between the substrates 72 and 75 at room temperature. UV-rays with a wavelength of 350 to 400 nm are irradiated to the mixed solution for one minute at 50 mW/cm², whereby the PDLC layer 73 is formed.

In the above, the liquid crystal K24 is in a smectic phase at room temperature, so that the liquid crystal K24 is also in a smectic phase at room temperature in each liquid crystal droplet. However, the orientation of the liquid crystal molecules are randomly oriented, depending upon each liquid crystal droplet. Therefore, the liquid crystal molecules are randomly oriented, when the PDLC layer 73 is seen as a whole, and anisotropy of dielectric constant is averaged. This can be said in the case where low molecular weight liquid crystal which is in a nematic phase at room temperature is used.

The liquid crystal K24 has a positive anisotropy of dielectric constant $\Delta\epsilon$, so that the liquid crystal molecules in the liquid crystal K24 are oriented in the direction of an electric field when the electric field is applied to the PDLC layer 73. A liquid crystal material having a negative $\Delta\epsilon$ can also be used as the storage medium, even though the orientation of the liquid crystal molecules in the material are oriented in the different direction from that of the liquid crystal K24.

Hereinafter, the write/rewrite and read of data in the non-volatile memory device of the present invention will be described in detail.

Write/rewrite

Data input from external devices is recorded in a buffer memory in the input/output signal control section 81. The data is written in the memory section 84 after being processed. The data is written by applying a voltage across the upper electrode 61 and the lower electrode 62 to generate heat in the heat generating layer 64, thereby heating the PDLC layer 73.

First of all, the case where low molecular weight liquid crystal which is in a smectic phase at room temperature is used will be described.

The PDLC layer 73 is heated to bring the low molecular weight liquid crystal in each liquid crystal droplet into a nematic phase or an isotropic phase. When the PDLC layer 73 is cooled to room temperature while being applied with an electric field under this condition, the low molecular weight liquid crystal has a smectic phase in which liquid crystal molecules thereof are oriented in the same direction. At this time, the capacity of the capacitor of each memory cell 63 is determined by a dielectric constant in the direction parallel with the orientation direction of the liquid crystal molecules in each liquid crystal droplet (where $\Delta\epsilon>0$), irrespective of the capacity loss due to the resin components of the polymer walls surrounding the liquid crystal droplets or the liquid crystal molecules oriented along the polymer walls.

When the PDLC layer 73 is cooled to room temperature under the condition that the PDLC layer 73 is not applied with an electric field, the anisotropy of dielectric constant of the low molecular weight liquid crystal is averaged when the PDLC layer 73 is seen as a whole. This is because the liquid crystal molecules in each liquid crystal droplet are randomly oriented, depending upon each liquid crystal droplet, even though the low molecular weight liquid crystal is in a smectic phase, however, as a result, the dielectric constant of the PDLC layer 73 is equivalently lowered, decreasing the capacity of the capacitor of each memory cell 63.

Hereinafter, the case where low molecular weight liquid crystal, which is in a nematic phase at room temperature, will be described.

The PDLC layer 73 is heated. When the low molecular weight liquid crystal in each liquid crystal droplet has an isotropic phase, the PDLC layer 73 is cooled to room temperature while the PDLC layer 73 is applied with an electric field. At this time, the low molecular weight liquid crystal is in a nematic phase in which the liquid crystal molecules thereof are oriented in the same direction. If the PDLC layer 73 is cooled to room temperature under the condition that the PDLC layer 73 is not applied with an electric field, the liquid crystal molecules in each liquid crystal droplet are randomly oriented, depending upon each liquid crystal droplet. The difference in orientation states is recorded as the difference in capacity of capacitors.

In the above-mentioned non-volatile memory device, data can be rewritten (overwritten) in the same way as in the write. The write/rewrite position can be freely selected, which makes possible a random access of data.

Read of data

A voltage is applied across the upper electrode 61 and the counter electrode 71. The electric capacity of the PDLC layer 73 is measured. The dielectric constant of the PDLC layer 73 in which the liquid crystal molecules are oriented is different from that in which the liquid crystal molecules are not oriented. Therefore, recorded data can be read, based on the difference of electric capacity.

In the case where the liquid crystal molecules constituting the liquid crystal droplets are oriented with a homeotropic structure, the PDLC layer 73 is in a transparent state; while in the case where the liquid crystal molecules are randomly oriented, the PDLC layer 73 is in an opaque state due to the light scattering. Data can be read by irradiating a laser beam or the like to the memory cell 63 and detecting the light reflected from the PDLC layer 73 this case, the surface of the PDLC layer 73 is required to be flat, so that a transparent flat layer such as a glass substrate should be provided on the surface of the PDLC layer 73. This method uses both of a photodetector and a signal processor. Thus, this method can be considered as an electrical method for reading data.

As is apparent from the above description, according to the present invention, data is written in a storage medium and is read therefrom by electrical control, so that transportation mechanisms such as a rotary mechanism and a head are not required as in magneto-optical disks and magnetic disks. Thus, miniaturized, simplified, and cost-cut structure of the device can be obtained.

In addition, since portions with a complicated and precision structure which are required for a laser pickup, a magnetic head, etc. are not necessary. Therefore, there is no possibility that the device is damaged due to the vibration, impact, and adhesion of dirts. Consequently, the stability of storing data and the reliability of the device can be remarkably improved.

Moreover, the structure of a memory cell is much more simplified, compared with the non-volatile memory device using an IC non-volatile memory. Therefore, a storage capacity is enlarged due to a memory cell with a large area. Also, by using a silicon substrate, a minute IC processing technique can be applied, making it possible to form a minute memory cell. Thus, a mass storage non-volatile memory device with a high density can be realized.

Furthermore, the storage medium is made of PDLC, so that low molecular weight liquid crystal having high anisotropy of dielectric constant can be used. Because of this, the size of each memory cell can be minimized, making it possible to provide the device with a high density. Also, the step of injecting liquid crystal into the gap between substrates is simplified and the orientation treatment of the substrates is not required. Thus, the production process is simplified and a non-volatile memory device can be obtained with good yield.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile memory device comprising:

a substrate;

a storage medium provided above the substrate;

a writing means having a heating means provided above the substrate, for heating the storage medium by the heating means to write data in the storage medium with a thermal change of a capacitance of the storage medium; and a reading means having an electrical reading means provided above the substrate, for reading the data by detecting the change in the capacitance of the storage medium, wherein the electrical reading means comprises first paired electrodes formed of first electrodes and second electrodes, which cross and overlap each other; and wherein the heating means comprises second paired electrodes formed of the second electrodes and third electrodes which cross and overlap the second electrodes and exothermic bodies respectively inserted in an intersection of each of said second paired electrodes.

2. A non-volatile memory device according to claim 1, wherein the first, second, and third electrodes are made of tungsten.

3. A non-volatile memory device according to claim 1, wherein the substrate is made of silicon.

4. A non-volatile memory device according to claim 1, wherein the storage medium comprises a liquid crystal compound or a compound containing a liquid crystal component in molecules thereof.

5. A non-volatile memory device according to claim 1, wherein the storage medium is made of polymer liquid crystal.

6. A non-volatile memory device according to claim 1, wherein the storage medium includes a polymer compound and liquid crystal droplets made of low molecular weight liquid crystal the liquid crystal droplets being dispersed in the polymer compound.

7. A non-volatile memory device according to claim 6, wherein the liquid crystal droplets are in a smectic phase at room temperature.

8. A non-volatile memory device according to claim 6, wherein the liquid crystal droplets are in a nematic phase at room temperature.

9. A non-volatile memory device according to claim 6, wherein the low molecular weight liquid crystal is changed in phase in the order of a crystal phase, a smectic phase, a nematic phase, and an isotropic phase with the increase in temperature.

10. A non-volatile memory device according to claim 6, wherein the low molecular weight liquid crystal is changed in phase in the order of a crystal phase, a smectic phase, and an isotropic phase with the increase in temperature.

11. A non-volatile memory device according to claim 6, wherein the low molecular weight liquid crystal is changed in phase in the order of a crystal phase, a nematic phase, and an isotropic phase with the increase in temperature.

12. A non-volatile memory device comprising:

a substrate;

a storage medium which is provided above the substrate and in which liquid crystal droplets made of low molecular weight liquid crystal are dispersed in a polymer compound;

a writing means having a heating means provided above the substrate, for heating the storage medium by the heating means to write data in the storage medium with a thermal change of a capacitance of the storage medium; and a reading means having an electrical reading means provided above the substrate, for reading the data by detecting the change in the capacitance of the storage medium, wherein the electrical reading means comprises first paired electrodes formed of first electrodes and second electrodes, which cross and overlap each other; and wherein the heating means comprises second paired electrodes formed of the second electrodes and third electrodes which cross and overlap the second electrodes and exothermic bodies respectively inserted in an intersection of each of said second paired electrodes.

13. A non-volatile memory device according to claim 12, wherein the heating means comprise paired electrodes formed of upper electrodes and lower electrodes which cross and overlap the upper electrodes and a heat generating layer disposed so as to be inserted in each intersection of the paired electrodes;

wherein the electrical reading means comprises paired electrodes formed of the upper electrodes and a counter electrode provided on a counter substrate facing the substrate; and wherein the storage medium is sandwiched between the substrate and the counter substrate.

14. A non-volatile memory device according to claim 12, wherein the substrate is made of silicon.

15. A non-volatile memory device according to claim 12, wherein the liquid crystal droplets are in a smectic phase at room temperature.

16. A non-volatile memory device according to claim 12, wherein the liquid crystal droplets are in a nematic phase at room temperature.

17. A non-volatile memory device according to claim 12, wherein the low molecular weight liquid crystal is changed in phase in the order of a crystal phase, a smectic phase, a nematic phase, and an isotropic phase with the increase in temperature.

18. A non-volatile memory device according to claim 12, wherein the low molecular weight liquid crystal is changed in phase in the order of a crystal phase, a smectic phase, and an isotropic phase with the increase in temperature.

19. A non-volatile memory device according to claim 12, wherein the low molecular weight liquid crystal is changed in phase in the order of a crystal phase, a nematic phase, and an isotropic phase with the increase in temperature.

20. A non-volatile memory device comprising:

a substrate;

a storage medium which is provided above the substrate and which is made of a liquid crystal compound or a compound containing a liquid crystal component in molecules thereof;

a writing means having a heating means provided above the substrate, for heating the storage medium by the heating means to write data in the storage medium with a thermal change of a physical value of the storage medium; and a reading means for optically reading data written in the storage medium, wherein the heating means comprises paired electrodes formed of first electrodes and second electrodes which cross and overlap the first electrodes and exothermic bodies respectively inserted in an intersection off each of said paired electrodes.

21. A non-volatile memory device according to claim 1, wherein the change in capacitance is caused by a variation of a dielectric constant of the storage medium.

22. A non-volatile memory device according to claim 1, wherein the first and second electrodes are capable of reading the data by detecting the change in capacitance of the storage medium, the change being caused by a variation of a dielectric constant of the storage medium.

23. A method for use of a non-volatile memory device, comprising:

(a) providing a non-volatile memory device comprising
  1) a substrate,
  2) a storage medium provided above the substrate,
  3) a writing component having a heating component provided above the substrate, for heating the storage medium by the heating component to write data in the storage medium with a thermal change of a capacitance of the storage medium, and
  4) a reading component having an electrical reading component provided above the substrate, for reading the data by detecting the change in the capacitance of the storage medium, wherein the electrical reading component comprises first paired electrodes formed of first electrodes and second electrodes, which cross and overlap each other; and the heating component comprises second paired electrodes formed of the second electrodes and third electrodes which cross and overlap the second electrodes and exothermic bodies respectively inserted in an intersection of each of said second paired electrodes, (b) electrically reading data written in the storage medium.

24. The method of claim 23 wherein the electrical reading component reads the data written in the storage medium by detecting a change in capacitance of the storage medium, the change being caused by a variation of a dielectric constant of the storage medium.

* * * * *